US009792893B1

(12) United States Patent
Gauger, Jr. et al.

(10) Patent No.: US 9,792,893 B1
(45) Date of Patent: Oct. 17, 2017

(54) IN-EAR ACTIVE NOISE REDUCTION EARPHONE

(71) Applicant: Bose Corporation, Framingham, MA (US)

(72) Inventors: Daniel M. Gauger, Jr., Berlin, MA (US); Anand Parthasarathi, Ashland, MA (US); Lei Cheng, Wellesley, MA (US); Matthew R. Hicks, Marlborough, MA (US); John Allen Rule, Berlin, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/270,392

(22) Filed: Sep. 20, 2016

(51) Int. Cl.

| | |
|---|---|
| ***H03B 29/00*** | (2006.01) |
| ***G10K 11/178*** | (2006.01) |
| ***H04R 1/10*** | (2006.01) |

(52) U.S. Cl.
CPC ....... *G10K 11/1788* (2013.01); *H04R 1/1016* (2013.01); *G10K 2210/1081* (2013.01); *G10K 2210/3026* (2013.01); *G10K 2210/3028* (2013.01)

(58) Field of Classification Search
CPC ..................................................... H03B 29/00
See application file for complete search history.

(56) References Cited

U.S. PATENT DOCUMENTS

| | | | | |
|---|---|---|---|---|
| 7,916,888 | B2 | 3/2011 | Sapiejewski et al. | |
| 8,073,150 | B2 | 12/2011 | Joho et al. | |
| 8,073,151 | B2 | 12/2011 | Joho et al. | |
| 8,238,567 | B2 | 8/2012 | Burge et al. | |
| 8,682,001 | B2 * | 3/2014 | Annunziato | G10K 11/16 381/71.12 |
| 8,737,669 | B2 | 5/2014 | Monahan et al. | |
| 2011/0243343 | A1 * | 10/2011 | Gauger, Jr. | G10L 21/0208 381/71.6 |
| 2015/0296297 | A1 * | 10/2015 | Hua | H04R 1/10 381/71.6 |
| 2016/0100259 | A1 * | 4/2016 | Guo | H04R 25/453 381/60 |
| 2016/0125866 | A1 * | 5/2016 | Park | G10K 11/178 381/71.11 |
| 2016/0171966 | A1 * | 6/2016 | Molinari | G10K 11/1782 381/71.6 |

(Continued)

*Primary Examiner* — Olisa Anwah

(57) ABSTRACT

An active noise reduction (ANR) earphone system includes a feedback microphone for detecting noise, feedback circuitry, responsive to the feedback microphone, for applying a digital filter $K_{fb}$ to an output of the feedback microphone to produce an antinoise signal, an electroacoustic driver for transducing the antinoise signal into acoustic energy, a housing supporting the feedback microphone and the driver near the entrance to the ear canal, and an ear tip for coupling the housing to the external anatomical structures of a first ear of a user and positioning the housing to provide a consistent acoustic coupling of the feedback microphone and the driver to the ear canal of the first ear. The acoustic coupling includes a tube of air defined by the combination of the housing and ear tip, having a length L and effective cross-sectional area A such that the ratio L/A is less than 0.6 $m^{-1}$.

18 Claims, 7 Drawing Sheets

(56) References Cited

U.S. PATENT DOCUMENTS

| | | | | |
|---|---|---|---|---|
| 2016/0196819 | A1* | 7/2016 | Wurtz | G10K 11/1786 381/94.3 |
| 2016/0267898 | A1* | 9/2016 | Terlizzi | H04R 1/1091 |
| 2016/0300562 | A1* | 10/2016 | Goldstein | G10K 11/1784 |
| 2017/0110105 | A1* | 4/2017 | Kumar | G10K 11/178 |
| 2017/0164122 | A1* | 6/2017 | Guo | H04R 25/453 |
| 2017/0180879 | A1* | 6/2017 | Petersen | H04R 25/305 |
| 2017/0213539 | A1* | 7/2017 | Magrath | G10K 11/178 |

* cited by examiner

IN-EAR ACTIVE NOISE REDUCTION EARPHONE

BACKGROUND

This disclosure relates to an in-ear active noise reduction earphone.

U.S. Pat. No. 8,682,001, incorporated here by reference, describes the acoustic and ergonomic structures of an in-ear active noise reduction earphone. A cross-sectional view of the earphone described in that patent, located in an ear, is shown in FIG. 1. The earphone 10 includes an electro-acoustic transducer, or driver, 12, mounted in a housing 14, having a front shell 16 and a rear shell 18. An ear tip 20 couples the housing to the ear. One feature described in that application is a nozzle 22 leading from a cavity 24 defined by the front shell 16 on the front side of the driver 12 into the user's ear canal. The acoustic mass of such a nozzle acts as an acoustic impedance that reduces the variation in the total response of such a headset from an ANR perspective when compared between different users, with different ear anatomy. Achieving uniformity of response through acoustic measures comes at the cost of performance, that is, the amount of sound cancellation that can be provided, is compromised in order to provide a similar response on different users.

We refer to the element to be inserted into or located on one ear as an "earphone." We refer to a system including two earphones, for use by one person, as a "set of earphones" or as "headphones." A set of earphones may also include wiring between the earphones, electronics coupled to the earphones through wired or wireless connections, user interface elements such as switches and displays, and connectors or radios for making wired or wireless connections to signal sources such as telephones, intercoms, and music players.

SUMMARY

With the addition of sophisticated signal processing that can change the filter parameters of an ANR system on a per-user basis, the acoustic design can be modified to provide greater noise cancellation, despite the increase in person-to-person performance variation caused by such a design.

In general, in one aspect, an active noise reduction (ANR) earphone system includes a feedback microphone for detecting noise, feedback circuitry, responsive to the feedback microphone, for applying a digital filter $K_{fb}$ to an output of the feedback microphone to produce an antinoise signal, an electroacoustic driver for transducing the antinoise signal into acoustic energy, a housing supporting the feedback microphone and the driver near the entrance to the ear canal, and an ear tip for coupling the housing to the external anatomical structures of a first ear of a user and positioning the housing to provide a consistent acoustic coupling of the feedback microphone and the driver to the ear canal of the first ear. The acoustic coupling includes a tube of air defined by the combination of the housing and ear tip, having a length L and effective cross-sectional area A such that the ratio L/A is less than 0.6 $mm^{-1}$.

Implementations may include one or more of the following, in any combination. The housing may at least partially define a front chamber containing the feedback microphone and bounded on one side by the radiating surface of the driver, acoustically coupled to the tube of air. The ear tip may smoothly transition from the portion of the front chamber defined by the housing into the ear canal. The housing may include a rigid nozzle portion, the ear tip may include a flexible nozzle portion ending in the outlet into the ear canal, the rigid nozzle portion of the housing and the flexible nozzle portion of the ear tip constituting the tube of air, and the acoustic impedance of the tube of air between the feedback microphone and the outlet being controlled by the dimensions of the rigid and flexible nozzle portions. The microphone may be located within the rigid nozzle portion of the housing. The driver may be located in an aperture in the housing, such that the radiating surface of the driver provides acoustic energy directly into the tube of air defined by the ear tip. The microphone may be located within the tube of air. The microphone may be located at a first end of the tube of air opposite a second end of the tube of air at which the driver provides the acoustic energy.

The digital filter $K_{fb}$ may be specific to an individualized system response $G_{ds}$ between the driver and the microphone when coupled to the first ear, the first ear being an individually-identified human ear. The digital filter $K_{fb}$ may be selected from a plurality of stored digital filters based on an identification of the first ear as corresponding to one of the digital filters. The feedback circuitry may measure the response $G_{ds}$ at a limited number of frequencies, based on the measured $G_{ds}$, determine an equalizer filter $K_{norm}$, combine the equalizer filter $K_{norm}$ with a fixed filter $K_{nom\text{-}fb}$ to generate the digital filter $K_{fb}$. The feedback circuitry may measure $G_{ds}$ and generate $K_{fb}$ each time the earphone system may be coupled to an ear.

In general, in one aspect, configuring a feedback filter $K_{fb}$ for use in an earphone having a feedback-based noise cancellation circuit includes, in a first processor, causing an electroacoustic driver of the earphone to output a calibration signal, receiving an output signal from a microphone acoustically coupled to the driver while the calibration signal may be being output, computing a response of the earphone $G_{ds}$ based on the calibration signal and the microphone output signal, computing a target filter having a response $K_{loop}/G_{ds}$ and determining filter coefficients that will cause $K_{fb}$ to have such a response, and providing the determined coefficients to a signal processor of the noise cancellation circuit.

Implementations may include one or more of the following, in any combination. Providing the coefficients to the signal processor may include, in the processor, storing the coefficients in a memory of the earphone, determining that the earphone may be located in an ear having the measured response $G_{ds}$, and loading the coefficients from the memory into the signal processor. The processor may also determine that the earphone is located in an ear having the measured response $G_{ds}$, and provide an authentication signal to an authentication program. The first processor and the signal processor may be implemented in a single processing device.

In general, in one aspect, an active noise reduction (ANR) earphone system includes a feedback microphone for detecting noise, digital feedback circuitry, responsive to the feedback microphone, for applying a filter to an output of the feedback microphone to produce an antinoise signal, an electroacoustic driver for transducing the antinoise signal into acoustic energy, a housing supporting the feedback microphone and the driver and maintaining the feedback microphone in a fixed position relative to the driver, a positioning and retaining structure for physically coupling the housing to the outer ear of the user, and an ear tip for acoustically coupling the feedback microphone and the driver to an ear canal of the user. The ear tip and the ear canal form a front chamber containing the feedback microphone and bounded entirely by an interior surface of the ear tip, an interior surface of the ear canal, the user's ear drum, and a radiating surface of the driver, and a tube of air between the radiating surface of the driver and the ear canal bounded by the ear tip may have a ratio of length L to effective area A no greater than 0.6 $mm^{-1}$.

In general, in one aspect, an active noise reduction (ANR) earphone system includes a feedback microphone for detecting noise, feedback circuitry, responsive to the feedback microphone, for applying a digital filter to an output of the feedback microphone to produce an antinoise signal, an electroacoustic driver for transducing the antinoise signal into acoustic energy, a housing supporting the feedback microphone and the driver and maintaining the feedback microphone in a fixed position relative to the driver, a positioning and retaining structure for coupling the housing to the outer ear of the user, and an ear tip for coupling the feedback microphone and the driver to an ear canal of the user. A front shell of the housing, the ear tip, and the ear canal form a front chamber containing the feedback microphone and bounded by an interior surface of the front shell, an interior surface of the ear tip, an interior surface of the ear canal, the user's ear drum, and a radiating surface of the driver. The interior surface of the ear tip makes up at least twenty percent of the bounding surface of the front chamber not including the interior surface ear canal.

Advantages include providing improved noise reduction by combining a more-variable physical design with filters that are customized to the individual response of the product in a user's ears.

All examples and features mentioned above can be combined in any technically possible way. Other features and advantages will be apparent from the description and the claims.

DESCRIPTION

Figure 1:
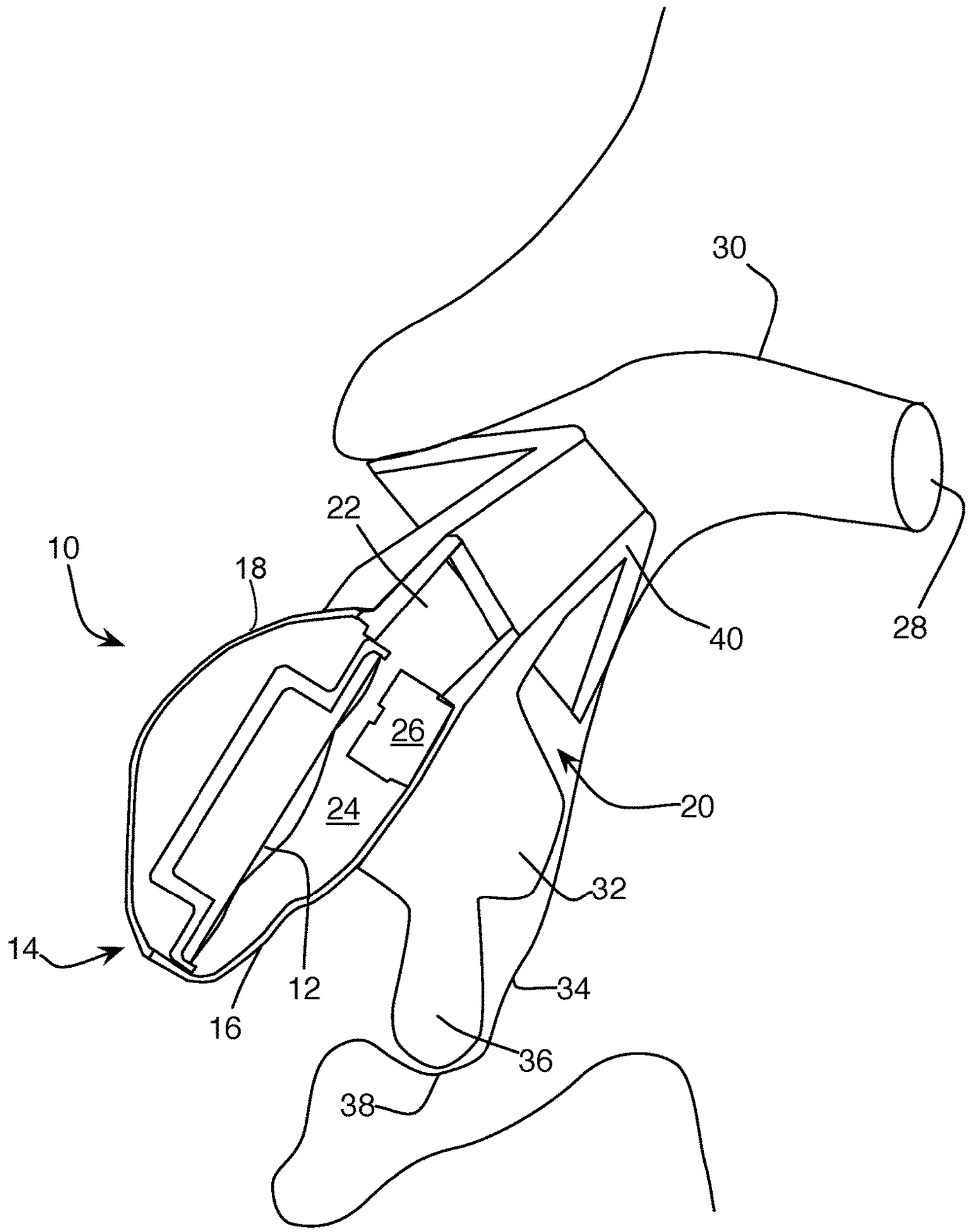
FIGS. 1 and 3 through 7 each show a cross-sectional view of an earphone positioned in an ear, viewed from above.

The nozzle described in the '001 patent mentioned above, and shown in FIG. 1, places acoustic impedance, in the form of an acoustic mass (i.e., a tube of air), between the driver 12 and the feedback, or system, microphone 26 on one side, and the ear drum 28, via the ear canal 30, on the other (note that an actual human ear canal is longer than that shown in FIG. 1, relative to the size of the earphone). We refer to the response from the driver to the system microphone, i.e., the response of the "plant," as $G_{ds}$ The plant response $G_{ds}$ varies both ear-to-ear, that is, between different users and between one user's left and right ears, and fit-to-fit, that is, between repeated fittings in the same ear. The amount of variation varies over the frequency of sound being reproduced, and tends to be greatest near ear canal resonances. A system that has little impedance between the plant (in particular, the feedback microphone 26) and the eardrum can provide greater acoustic potential noise cancellation than one with a larger impedance. However, to deliver effective cancellation, the feedback loop needs to have bandwidth that extends into frequencies where the variation in $G_{ds}$ is substantial. For example, it would be desirable for the feedback loop to be operable up to as much as 4 kHz, but the ear-to-ear variation in a system with little impedance between the plant and the eardrum may exceed 10 dB at 2 kHz and 20 dB at 4 kHz, requiring that the feedback loop be limited to operating over frequencies up to 1.5 kHz to provide stable performance for all users. For comparison, the system shown in FIG. 1 has ear-to-ear variation of 2 dB at 2 kHz and 7 dB at 4 kHz, when fit properly to the ear.

Figure 2A:
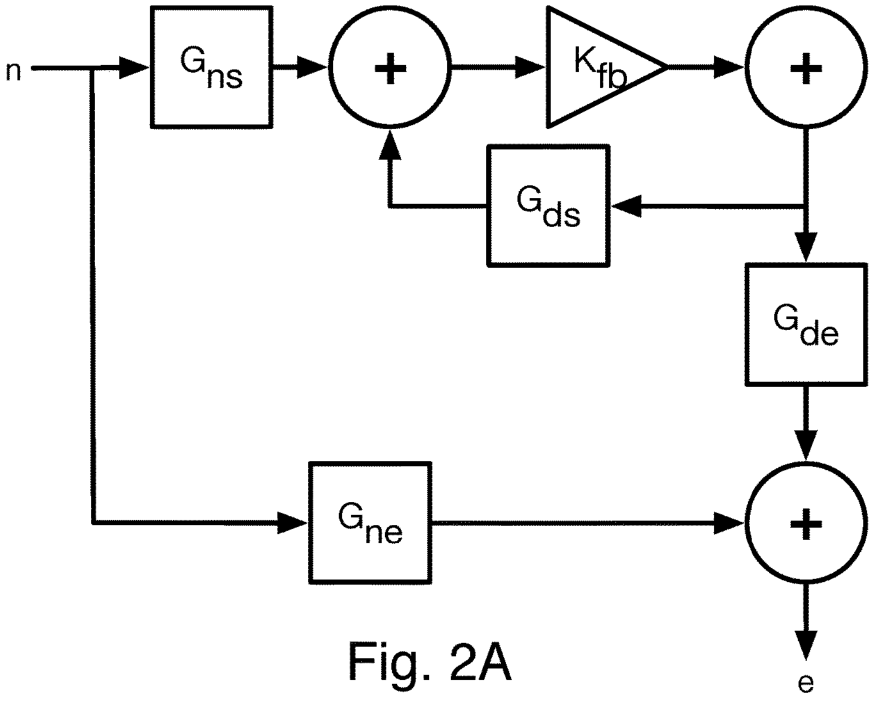
FIG. 2A shows a block diagram of an active noise reduction headphone and FIG. 2B shows an equivalent circuit model corresponding to the block diagram.
Figure 2B:
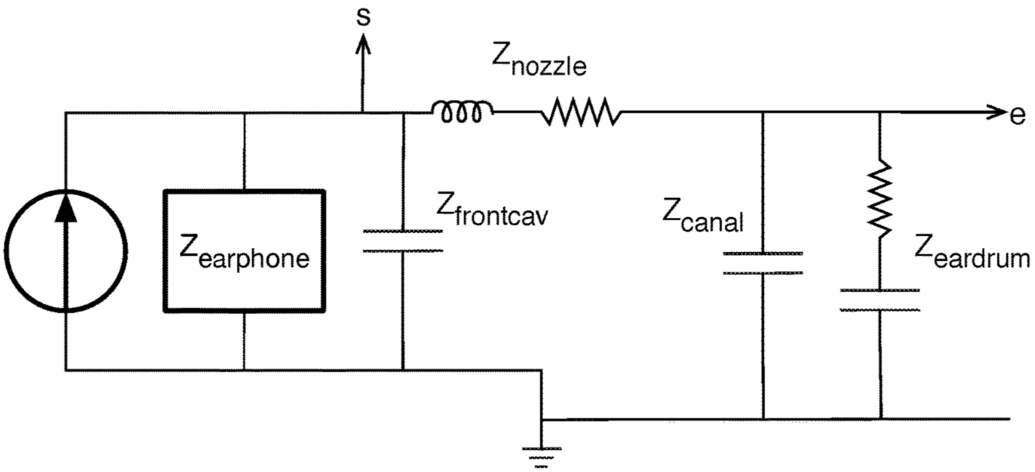

To understand why nozzle acoustic impedance has an effect on both acoustic potential noise cancellation and $G_{ds}$ variation, see FIGS. 2A and 2B. FIG. 2A is a block diagram of a feed-back based ANR headphone, and FIG. 2B is the corresponding equivalent circuit. Together, they provide a general model of an ANR system based on the measured frequency responses between different key points in the system. There are other, more-sophisticated ways to model the system, but the example in FIGS. 2A and 2B is sufficient, simple and illustrative. Each of the $G_{xy}$ terms represents the system response between sound pressure at two locations x and y. The locations used in the model are noise source n, system (feedback) microphone s, driver d, and ear e. The feedback filter is $K_{fb}$, and the various impedances are represented as $Z_{location}$. From this model one can derive the insertion gain e/n for the ANR ear cup or earphone as:

$$\frac{e}{n} = G_{ne} * \left[1 + \frac{\Delta_d}{\Delta_n} * \frac{G_{ds}K_{fb}}{1 - G_{ds}K_{fb}}\right]$$

where $\Delta_d$ is the ratio of pressures at the ear to that at the feedback microphone (e/s) when a signal is applied to the driver and $\Delta_n$ is the ratio of pressures at the same two points when noise is applied externally. A microphone may be placed in the canal of the wearer as a measure of the pressure at the ear. In this equation, $G_{ne}$ is the passive insertion gain resulting from the presence of the earphone in the ear and the term in square brackets is the additional noise reduction the feedback system provides.

One can see that, if the acoustics are ideal such that the sound pressure detected by the feedback microphone corresponds perfectly to that at the ear when excited by either the driver or noise, then the ratio $\Delta_d/\Delta_n=1$ and the active contribution to the insertion gain is $1/(1-G_{ds}K_{fb})$. To minimize insertion gain (maximize noise reduction), one wishes to maximize the feedback loop gain bandwidth $G_{ds}K_{fb}$. If, however, one considers non-ideal acoustics where $\Delta_d/\Delta_n \neq 1$ combined with an ideal feedback system where $G_{ds}K_{fb}$ approaches infinity (ignoring stability, in the limit), then the active contribution to insertion gain is $1-\Delta_d/\Delta_n$, the acoustic potential noise cancellation. To maximize this term, one wants $\Delta_d=\Delta_n$.

Next, consider the effect of nozzle acoustic impedance on both $\Delta_d$ and on variation in $G_{ds}$. FIG. 2B shows a lumped parameter simplified circuit model for the acoustics of an earphone coupled to the ear. In this impedance analogy model, the variable flowing through elements corresponds to acoustic volume velocity and the variable appearing across elements corresponds to sound pressure and the voltage applied to the driver, reflected to acoustic elements, appears as a current source. See, e.g., *Acoustics*, Leo L. Beranek, American Institute of Physics, 1954, 1986. The model includes a Norton equivalent circuit for the earphone including the mechanical and electrical properties of the driver and the acoustical effects of any ports in the earphone's construction (see, e.g., U.S. Pat. No. 7,916,888, incorporated here by reference). These effects are combined into impedance $Z_{earphone}$. The earphone's output volume velocity divides between the volume of air (an acoustic compliance)

contained in its front cavity, $Z_{frontcav}$ and the nozzle connecting to the ear canal, as represented by series acoustic mass and resistance $Z_{nozzle}$. The nozzle then connects to the ear canal $Z_{canal}$, modeled at low frequencies as a compliance (as shown) and above approximately 1 kHz by a waveguide ladder network (not shown), followed by a series resistance and compliance representing the eardrum, $Z_{eardrum}$. From this model one can see that, if $Z_{nozzle}$ is large, then it will make the signal from the feedback microphone less sensitive to changes in the acoustics of the ear canal and eardrum, resulting in $G_{ds}$ primarily depending on the interaction of $Z_{earphone}$, $Z_{frontcav}$ and $Z_{nozzle}$. This reduces variation in $G_{ds}$, making it easier to design a wideband feedback loop $G_{ds}K_{fb}$. However, with large $Z_{nozzle}$, a pressure divide is created between the nozzle impedance and that of the ear canal, in particular including the low order terms represented by the compliances (capacitors) shown in the circuit that describe ear canal volume and eardrum impedance. This divide results in increasing $\Delta_d$, reducing the acoustic potential noise cancellation.

Designing a feedback loop for stability requires matching the $K_{fb}$ filter to the plant $G_{ds}$ to achieve acceptable loop gain $K_{fb}G_{ds}$. For a circumaural or supra-aural headset design, with little plant-to-ear impedance, $G_{ds}$ changes every time the headphone is donned or the user adjusts the positions of the ear cup for comfort, so the feedback loop filter $K_{fb}$ needed to achieve a wide-bandwidth feedback loop would need to continuously adapt. However, a continuously adaptive feedback controller would be complicated, expensive, and power-hungry. The more common solution is to limit bandwidth of the feedback loop. As one of skill in the art will appreciate, other filters that may be used in the headphone, such as $K_{ff}$ for a feed-forward microphone and $K_{eq}$ for equaling input audio signals, will be changed to adjust for the customization of $K_{fb}$.

Figure 3:
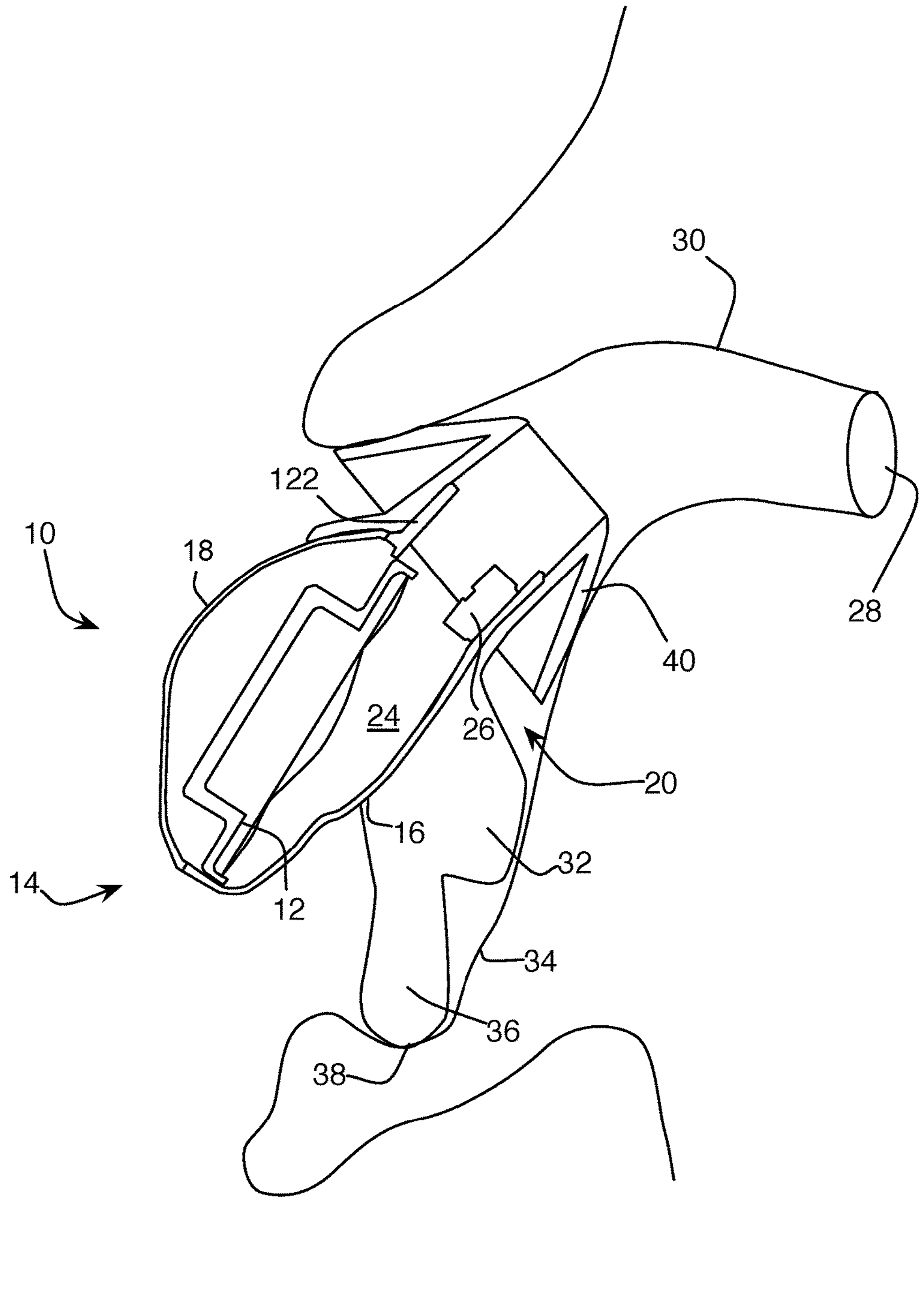

The earphone in the example of FIG. 1 is designed to provide an impedance selected to balance the potential cancellation with providing consistent performance with a fixed $K_{fb}$, despite ear-to-ear and fit-to-fit variation. The acoustic mass which dominates the impedance can be characterized as the ratio of the length of the nozzle to its area, L/A. When noting particular values for L and A, we use geometric measurements. Specifically, L is taken as the length from the start of the nozzle near the driver to the end of the ear tip mounted on the earphone. A is derived from CAD calculations of the volume in that region divided by L, but could be measured specifically, depending on the regularity of the nozzle. Effective L/A values can also be derived from acoustic measurements, but those would be subject to end effects, leading to somewhat different values for the same design. FIG. 3 shows a designs with a shorter, wider nozzle 122. The L/A of the nozzle 122 provides a slightly lower impedance than in FIG. 1. In addition, the feedback microphone is moved into the nozzle, further decreasing the impedance between the microphone and the ear canal.

Figure 4:
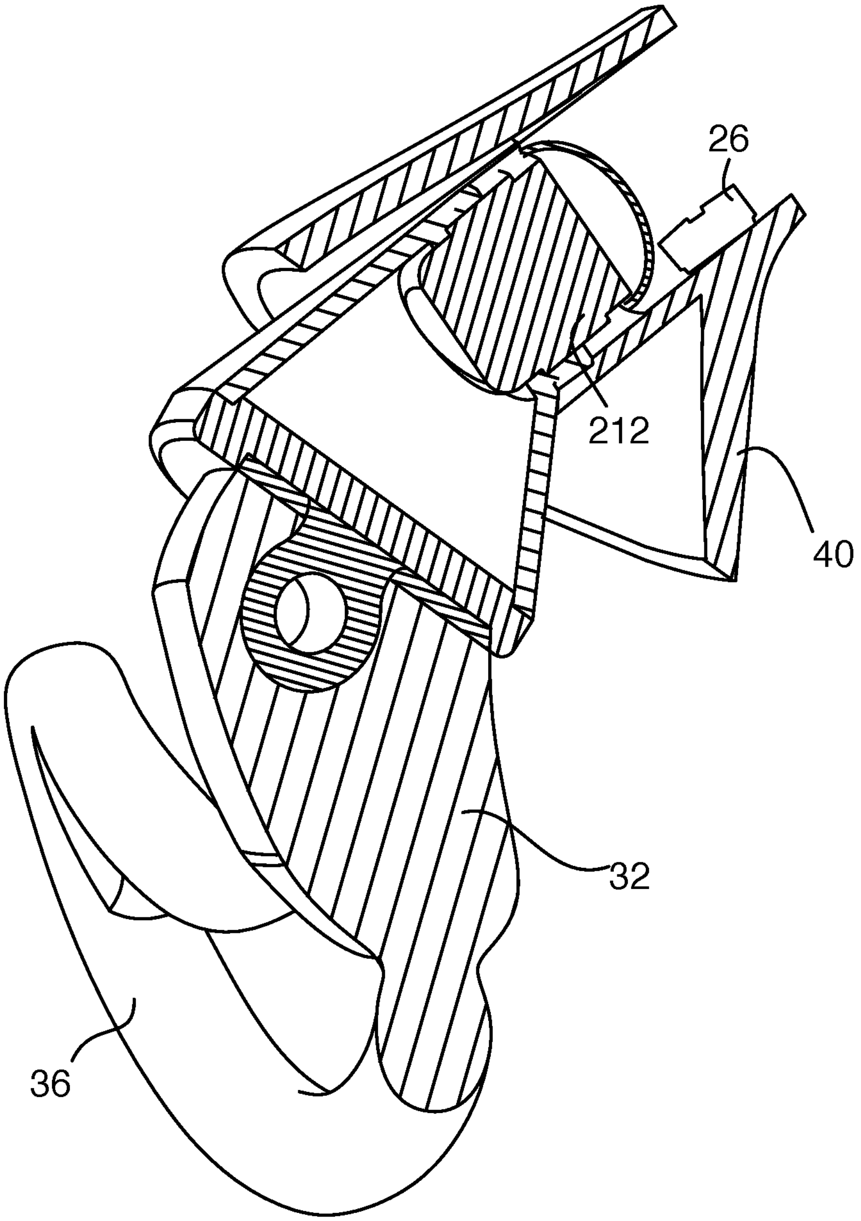

Decreasing the L/A impedance provides better maximum potential cancellation, but increased ear-to-ear variation means that a fixed $K_{fb}$ filter is no longer viable. The design shown in FIG. 1 also includes a positioning and retaining structure extending from the ear tip 20, described in additional detail in U.S. Pat. No. 8,737,669, filed Jun. 28, 2011, and incorporated here by reference. That positioning and retaining structure includes a body 32 resting in the bowl of the concha 34, an arm 36 following the curve of the antihelix 38, and a flange 40 sealing the entrance of the ear canal 30 around the nozzle 22. Every ear is unique; by "entrance" to the ear canal, we refer to the area where the bowl of the concha transitions to the opening of the canal, up to the point where the flesh turns a corner (in most ears) into the remainder of the tube of the canal (the first bend). The tip also, in the configuration shown, extends the nozzle and contributes to the L/A ratio defining the impedance. While the shortened and widened nozzle 122 of FIG. 3 or the complete lack of a nozzle in FIG. 4 increases ear-to-ear variation, when it is combined with the positioning and retaining structure from the earphone of FIG. 1 (adapted to the new nozzle dimensions), repeatable fit-to-fit positioning is achieved for fittings in a given ear. As a result, the $G_{ds}$ response varies greatly from one ear to another, but varies very little from fit to fit in one ear. This means that the corresponding $K_{fb}$ can be determined once, per ear. A process for determining and loading an appropriate pre-determined $K_{fb}$ by matching the ear to the pre-determined $K_{fb}$ is described in co-pending patent application Ser. No. 14/993,329, filed Jan. 12, 2016, the entire contents of which are incorporated here by reference. It happens that the acoustics described in this application that enable high cancellation through close acoustic coupling and custom $K_{fb}$ filters also improve the accuracy of such ear-identification processes, because they increase the amount of $G_{ds}$ change ear-to-ear. They also enable identification of the individual ear to such a degree that it can be used for biometric authentication. In particular, the location of one or more resonances or other frequency response features of the determined $G_{ds}$ or $K_{fb}$ can serve as a unique digital signature of the ear. The entropy present in the location of such resonances can be augmented by having the user speak during identification, and using the location of formants in the voice as further identification markers.

Because this design results in a $G_{ds}$ that varies only ear-to-ear and not fit-to-fit, it can be used with a customizable digital ANR system to provide an ANR headphone that provides the maximum performance for a given user. As mentioned above, providing an ANR headphone with a feedback loop filter $K_{fb}$ that dynamically varies is difficult and expensive; however, providing one that can be set up once to use a custom $K_{fb}$, per ear, for a given user, is now feasible. A highly configurable digital signal processor, like that described in U.S. Pat. Nos. 8,073,150 and 8,073,151, can be configured at a point of initial setup to find a set of filter coefficients that provide the maximum cancellation for a given user's ears. Various methods may be employed to initially generate customized feedback and/or feed-forward controllers given knowledge of the plant and a desired plant response, as is appreciated by a person of ordinary skill in the art given the benefit of this disclosure. In one example, the following process is employed:

a) The headphone is connected to a computing device, such as a mobile phone running a configuration app.
b) When commanded by configuration code in the app, a calibration signal is output by the driver and captured by the microphone; either the microphone signal alone for each earbud or both the microphone and driver signals are then provided to the app.
c) The app computes Gds from the signals provided by the headphone or, optionally, uploads the signals to a remote server where the computation is done.
d) The app or server has a target loop-gain $K_{loop}$ pre-set as best for the acoustics of the earbud and which provides appropriate margin allowing for fit-to-fit variation within a given ear. That target may be adjusted over time, based on customer satisfaction feedback.

e) The app or server computes a target $K_{loop}/G_{ds}$ and then runs any of a number of known routines to determine filter coefficients defining the $K_{fb}$ to implement it (for one example, the routine invfreqz.m published by MathWorks of Natick, Mass., for use in their Matlab software).

f) The app or server, after factoring these coefficients for best implementation in the DSP, transfers them to the headphone's processor to load them into the DSP and store for future use.

In some examples, the fitting process measures a portion of $G_{ds}$ (at only frequencies where variation is high) and uses those to determine an equalizer $K_{norm}$. The resulting $G_{ds}*K_{norm}$ will have sufficiently less variation such that a pre-designed nominal fixed $K_{nom\text{-}fb}$ can be used, such that $K_{fb}$ in effect becomes $K_{norm}*K_{nom\text{-}fb}$. If the variation $K_{norm}$ equalizes is simple, such as the center frequency of a strong ear canal resonance, signal processing methods such as band-passing the feedback microphone signal to include only signals over the relevant frequency range and counting zero crossings of that signal may be used. This approach is simple enough that it can be used for continuous adaptation. If the variation is more complex, a short and pleasant ear identification sound can be played each time the earphones are fitted to the ear; this may be triggered manually or by means of some sensors that detect that the earphones have been donned, such as U.S. Pat. No. 8,238,567 or co-pending application Ser. No. 15/189,649, the entire contents of which are hereby incorporated by reference. The level of signal at different frequencies in the feedback mic signal, in response to this ear identification sound, are then used to determine the appropriate $K_{norm}$, by means such as a hash function applied to the FFT of the feedback microphone signal that indexes a set of possible $K_{norm}$ coefficient sets. A neural network may be used to determine an efficient mapping from the FFT of the feedback microphone signal to the $K_{norm}$ coefficient set. This approach further eliminates any instability or lack of performance due to fit-to-fit variation as well as the earphones being shared among several individuals. With a sufficiently-powerful device paired to the headphones, the full $K_{fb}$ to $K_{loop}/G_{ds}$ fitter may be performed each time or, conceivably, the computation can all be done in the headphone itself rather than in a connected computing device.

Figure 5:
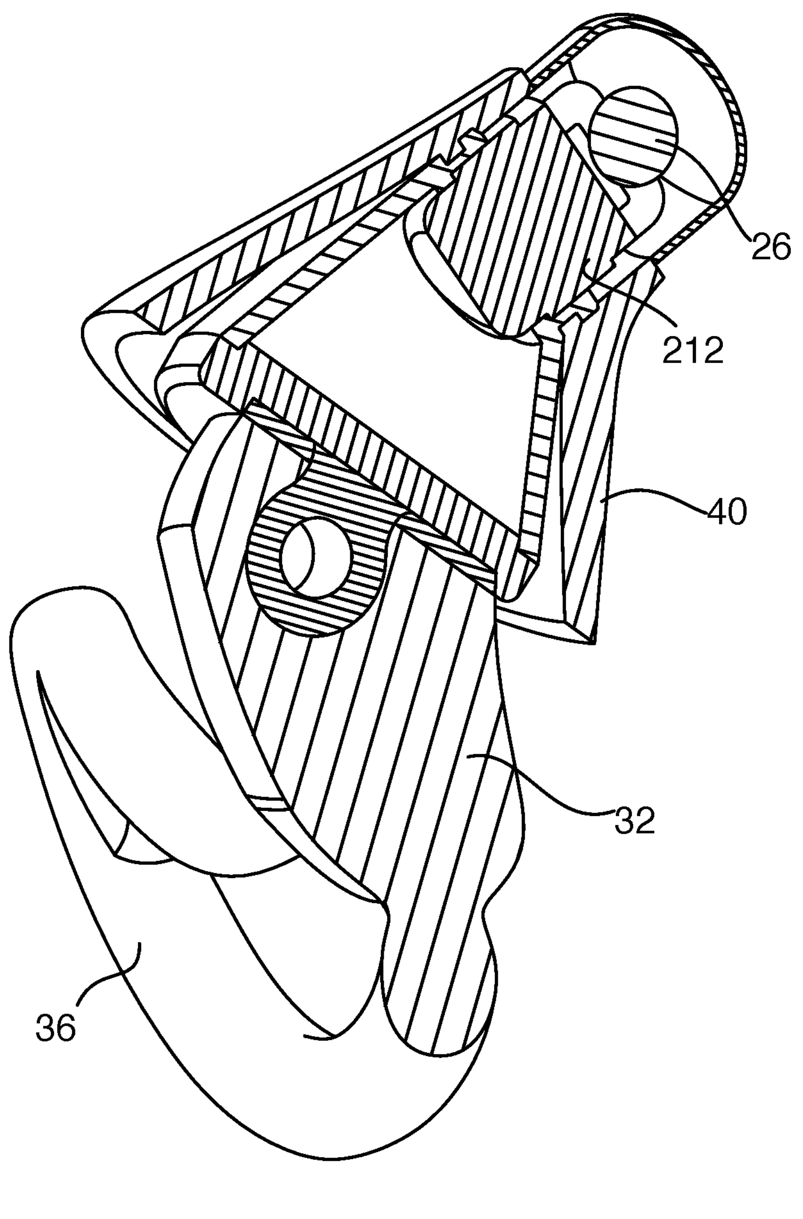
Figure 6:
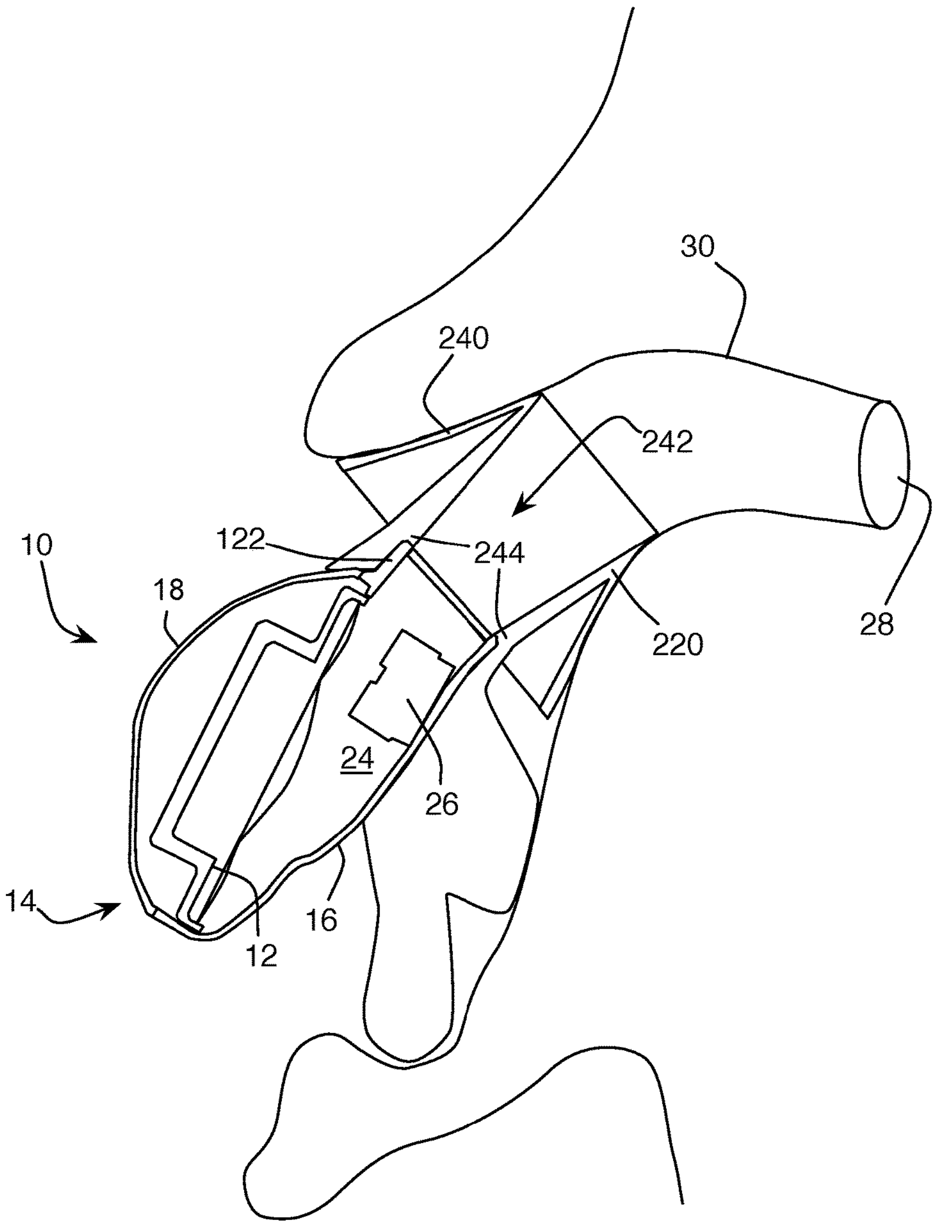

The design shown in FIG. 3 can be characterized in several ways. As noted above, the principle goal is to reduce the impedance between the plant and the ear canal, and this is done by decreasing the L/A ratio of the nozzle 122. Both a shorter nozzle length and a wider nozzle area lead to such an improvement. Ultimately, the goal is a close coupling of the driver to the ear canal. Generally, while the design of FIG. 1 provides an L/A of 0.8 $mm^{-1}$, a design having an L/A of less than 0.6 $mm^{-1}$ provides the desired coupling. For the same nozzle area as FIG. 1 (15 $mm^2$), a length of 8.5 mm would work, which is shown in FIG. 3. For the nozzle length from FIG. 1 (12 mm), the area would need to be 20 $mm^2$. The L/A impedance can be made even lower using a nozzle that is both shorter and wider than that of FIG. 1, in part by using a very small driver 212 and moving it into the nozzle, such as that shown in FIG. 4, which is based on a prototype having a length of 4 mm and an area of 12.6 $mm^2$, for an L/A ratio of 0.32 $mm^{-1}$. Such a small driver is described, for example, in co-pending patent application Ser. No. 15/182,039, filed Jun. 14, 2016, the entire contents of which are incorporated here by reference. FIG. 5 shows another design, in which the driver 212 directly fires into the ear canal, with no nozzle, and with the feedback microphone 26 located directly in front of the driver. In this case, L/A is effectively zero. Note that with nozzle dimensions of length L and effective cross-sectional area A, the acoustic mass is $\rho \times L/A$, where $\rho$ is the density of air, and the impedance is $j\omega \times \rho \times L/A$ In addition to the L/A mass, the transitions from the driver cavity to the nozzle and from the nozzle to the ear canal also impose impedances, and these impedances can be reduced by smoothing the transitions, as shown in FIG. 6. There are various ways to smooth the transitions between the front cavity 24 and the ear canal 30. In one example, the cross-sectional shape of the flange portion 240 of the modified ear tip 220 is modified to better match the anatomy of an individual human ear. Rather than ending in an oval smaller than the ear canal entrance, as in FIGS. 1 and 2, the end of the flange is widened and thinned, so that it touches the side walls of the ear canal, and tapers away, with a minimal bead around its end. By "smooth transition" we mean a large value for the ratio of the smaller area on one side of the transition (such as the cross-sectional area in the end of the tip) to the larger cross-sectional area of the entrance of the ear canal. The ideal value for this ratio is 1, which would be a completely smooth transition. For the design of FIG. 1, the cross-sectional area at the end of the tip is 15 $mm^2$ and the average cross sectional area at the entrance of the ear canal is 38 $mm^2$ for a ratio of 0.4. Other area transitions in the earphone design impose impedance as well; for example, to reduce impedance the inside bore 242 of the tip of the ear tip 220 is matched to the inside bore of the nozzle 122, with steps 244, so that the inside of the two parts forms a smooth pathway. The earphone may also be modified to provide smooth transitions. As one example, shown in FIG. 5, the driver is repositioned so that the diaphragm ends in-plane with the edge of the nozzle 122.

Figure 7:
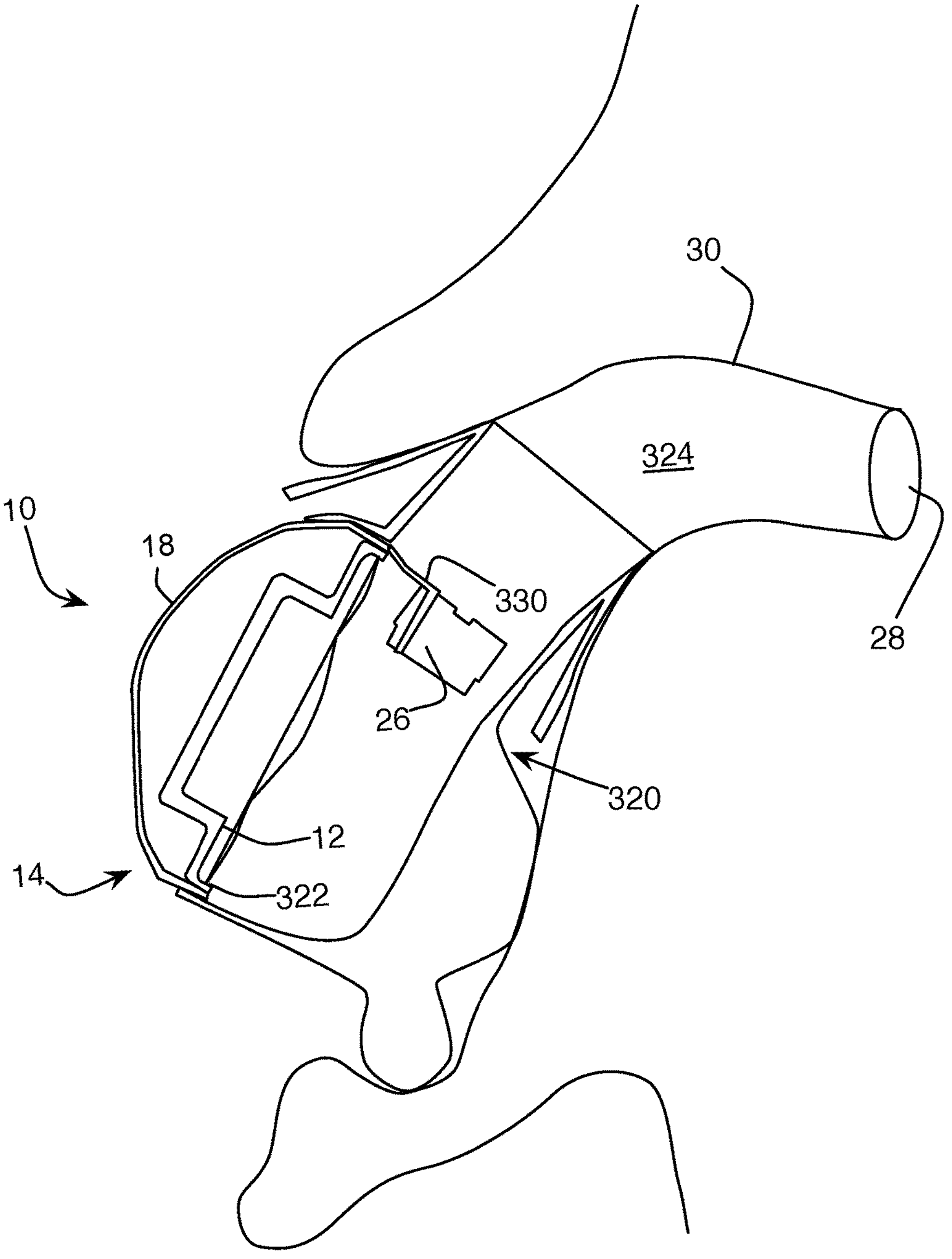

As shown in FIG. 7, the nozzle and front cavity of the housing can be completely eliminated, leaving only the ear tip to couple the driver to the ear canal and to define the boundary of the front cavity. With this construction, the front cavity 324 of the earphone, normally provided by the housing and nozzle, is simply the volume inside the ear tip and the ear canal. The ear tip 320 is made from a material that is stiff enough at the inner bore to maintain its shape reasonably well against crushing, so that the front cavity does not collapse when the earphone is inserted to the ear, while being thin enough at the flange to provide a smooth transition from the inside surface of the ear tip to the inside surface of the ear canal.

Coupling the driver to the ear canal to provide minimal impedance between the plant and the eardrum can be combined with more effective positioning of the system microphone 26, also shown in FIGS. 5 and 6. Positioning the system microphone, for both location and orientation, requires the system designer to make a trade-off between maximizing acoustic potential cancellation and feedback loop bandwidth. To maximize acoustic potential cancellation, the microphone should be positioned to capture as accurately as possible the sound at the actual location of the ear drum (decreasing $\Delta_d/\Delta_n$)—this would generally mean farther from the driver, toward or into the ear canal, so as to reduce the nozzle impedance between the feedback microphone and the eardrum. Maximizing feedback loop bandwidth, however, requires minimizing non-minimum phase in $G_{ds}K_{fb}$, which is achieved by positioning the microphone close to the driver, to minimize the time delay between generation of anti-noise sounds and detection of the residual noise, as well as by minimizing any delay introduced by a digital feedback system, as described in U.S. Pat. No.

8,073,150. With a sufficiently low-delay digital implementation of the feedback controller, capable of being changed to implement a $K_{fb}$ matched to $G_{ds}$, the best acoustic potential noise cancellation may result from positioning the microphone in or at the ear canal end of the nozzle.

A number of implementations have been described. Nevertheless, it will be understood that additional modifications may be made without departing from the scope of the inventive concepts described herein, and, accordingly, other embodiments are within the scope of the following claims.

What is claimed is:

1. An active noise reduction (ANR) earphone system comprising:

a feedback microphone for detecting noise;

feedback circuitry, responsive to the feedback microphone, for applying a digital filter $K_{fb}$ to an output of the feedback microphone to produce an antinoise signal;

an electroacoustic driver for transducing the antinoise signal into acoustic energy;

a housing supporting the feedback microphone and the driver near the entrance to the ear canal; and an ear tip for coupling the housing to the external anatomical structures of a first ear of a user and positioning the housing to provide a consistent acoustic coupling of the feedback microphone and the driver to the ear canal of the first ear;

wherein the acoustic coupling includes a tube of air defined by the combination of the housing and ear tip, having a length L and effective cross-sectional area A such that the ratio L/A is less than 0.6 $mm^{-1}$.

2. The earphone system of claim 1, wherein the housing at least partially defines a front chamber containing the feedback microphone and bounded on one side by the radiating surface of the driver, acoustically coupled to the tube of air.

3. The earphone system of claim 2, wherein the ear tip smoothly transitions from the portion of the front chamber defined by the housing into the ear canal.

4. The earphone system of claim 1, wherein the housing comprises a rigid nozzle portion, the ear tip comprises a flexible nozzle portion ending in the outlet into the ear canal, the rigid nozzle portion of the housing and the flexible nozzle portion of the ear tip constituting the tube of air, and the acoustic impedance of the tube of air between the feedback microphone and the outlet is controlled by the dimensions of the rigid and flexible nozzle portions.

5. The earphone system of claim 4, wherein the microphone is located within the rigid nozzle portion of the housing.

6. The earphone system of claim 1, wherein the driver is located in an aperture in the housing, such that the radiating surface of the driver provides acoustic energy directly into the tube of air defined by the ear tip.

7. The earphone system of claim 5, wherein the microphone is located within the tube of air.

8. The earphone system of claim 5, wherein the microphone is located at a first end of the tube of air opposite a second end of the tube of air at which the driver provides the acoustic energy.

9. The earphone system of claim 1, wherein the digital filter $K_{fb}$ is specific to an individualized system response $G_{ds}$ between the driver and the microphone when coupled to the first ear, the first ear being an individually-identified human ear.

10. The earphone system of claim 9, wherein the digital filter $K_{fb}$ is selected from a plurality of stored digital filters based on an identification of the first ear as corresponding to one of the digital filters.

11. The earphone system of claim 9, wherein the feedback circuitry is configured to:

measure the response $G_{ds}$ at a limited number of frequencies, based on the measured $G_{ds}$, determine an equalizer filter $K_{norm}$, combine the equalizer filter $K_{norm}$ with a fixed filter $K_{nom\text{-}fb}$ to generate the digital filter $K_{fb}$.

12. The earphone system of claim 11, wherein the feedback circuitry is configured to measure $G_{ds}$ and generate $K_{fb}$ each time the earphone system is coupled to an ear.

13. A method of configuring a feedback filter $K_{fb}$ for use in an earphone having a feedback-based noise cancellation circuit, the method comprising:

in a first processor, causing an electroacoustic driver of the earphone to output a calibration signal;

receiving an output signal from a microphone acoustically coupled to the driver while the calibration signal is being output;

computing a response of the earphone $G_{ds}$ based on the calibration signal and the microphone output signal;

computing a target filter having a response $K_{loop}/G_{ds}$ and determining filter coefficients that will cause $K_{fb}$ to have such a response; and providing the determined coefficients to a signal processor of the noise cancellation circuit.

14. The method of claim 13, wherein providing the coefficients to the signal processor comprises, in the processor:

storing the coefficients in a memory of the earphone, determining that the earphone is located in an ear having the measured response $G_{ds}$, and loading the coefficients from the memory into the signal processor.

15. The method of claim 13, further comprising, in the processor:

determining that the earphone is located in an ear having the measured response $G_{ds}$, and providing an authentication signal to an authentication program.

16. The method of claim 13, wherein the first processor and the signal processor are implemented in a single processing device.

17. An active noise reduction (ANR) earphone system comprising:

a feedback microphone for detecting noise;

digital feedback circuitry, responsive to the feedback microphone, for applying a filter to an output of the feedback microphone to produce an antinoise signal;

an electroacoustic driver for transducing the antinoise signal into acoustic energy;

a housing supporting the feedback microphone and the driver and maintaining the feedback microphone in a fixed position relative to the driver;

a positioning and retaining structure for physically coupling the housing to the outer ear of the user; and an ear tip for acoustically coupling the feedback microphone and the driver to an ear canal of the user;

wherein the ear tip and the ear canal form a front chamber containing the feedback microphone and bounded entirely by an interior surface of the ear tip, an interior surface of the ear canal, the user's ear drum, and a radiating surface of the driver, and a tube of air between the radiating surface of the driver and the ear canal bounded by the ear tip has a ratio of length L to effective area A no greater than 0.6 $mm^{-1}$.

18. An active noise reduction (ANR) earphone system comprising:

a feedback microphone for detecting noise;

feedback circuitry, responsive to the feedback microphone, for applying a digital filter to an output of the feedback microphone to produce an antinoise signal;

an electroacoustic driver for transducing the antinoise signal into acoustic energy;

a housing supporting the feedback microphone and the driver and maintaining the feedback microphone in a fixed position relative to the driver;

a positioning and retaining structure for coupling the housing to the outer ear of the user; and an ear tip for coupling the feedback microphone and the driver to an ear canal of the user;

wherein a front shell of the housing, the ear tip, and the ear canal form a front chamber containing the feedback microphone and bounded by an interior surface of the front shell, an interior surface of the ear tip, an interior surface of the ear canal, the user's ear drum, and a radiating surface of the driver, and the interior surface of the ear tip makes up at least twenty percent of the bounding surface of the front chamber not including the interior surface ear canal.

* * * * *